(12) United States Patent
Hung et al.

(10) Patent No.: US 8,263,462 B2
(45) Date of Patent: Sep. 11, 2012

(54) DIELECTRIC PUNCH-THROUGH STOPPERS FOR FORMING FINFETS HAVING DUAL FIN HEIGHTS

(75) Inventors: Shih-Ting Hung, Sanchong (TW); Cheng-Hung Chang, Hsin-Chu (TW); Chen-Yi Lee, Keelung (TW); Chen-Nan Yeh, Hsi-Chih (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/347,123

(22) Filed: Dec. 31, 2008

(65) Prior Publication Data

US 2010/0163971 A1  Jul. 1, 2010

(51) Int. Cl.
*H01L 29/772* (2006.01)
(52) U.S. Cl. ........ 438/286; 438/294; 257/288; 257/297; 257/E29.112
(58) Field of Classification Search .................. 257/288, 257/327, 497, E29.112, E29.255; 438/197, 438/286, 294
See application file for complete search history.

(56) References Cited

U.S. PATENT DOCUMENTS

| | | | |
|---|---|---|---|
| 5,972,758 A | 10/1999 | Liang | |
| 6,376,286 B1 | 4/2002 | Ju | |
| 6,706,571 B1 | 3/2004 | Yu et al. | |
| 6,858,478 B2 | 2/2005 | Chau et al. | |
| 6,909,147 B2 * | 6/2005 | Aller et al. | 257/347 |
| 7,180,134 B2 | 2/2007 | Yang et al. | |
| 7,190,050 B2 | 3/2007 | King et al. | |
| 7,208,796 B2 | 4/2007 | Chang et al. | |
| 7,247,887 B2 | 7/2007 | King et al. | |
| 7,265,008 B2 | 9/2007 | King et al. | |
| 7,297,600 B2 | 11/2007 | Oh et al. | |
| 7,320,908 B2 | 1/2008 | Son et al. | |
| 7,332,386 B2 | 2/2008 | Lee et al. | |
| 7,396,726 B2 | 7/2008 | Oh et al. | |
| 7,508,031 B2 | 3/2009 | Liu et al. | |

(Continued)

FOREIGN PATENT DOCUMENTS
CN   1681103   10/2005
(Continued)

OTHER PUBLICATIONS

Hisamoto, D., et al., "A Fully Depleted Lean-Channel Transistor (DELTA)—A Novel Vertical Ultra Thin SOI MOSFET—," International Electron Devices Meeting, 1989, pp. 833-836.

(Continued)

*Primary Examiner* — Jarrett Stark
*Assistant Examiner* — Michele Fan
(74) *Attorney, Agent, or Firm* — Slater & Matsil, L.L.P.

(57) ABSTRACT

A semiconductor structure includes a semiconductor substrate having a first portion and a second portion. A first Fin field-effect transistor (FinFET) is formed over the first portion of the semiconductor substrate, wherein the first FinFET includes a first fin having a first fin height. A second FinFET is formed over the second portion of the semiconductor substrate, wherein the second FinFET includes a second fin having a second fin height different from the first fin height. A top surface of the first fin is substantially level with a top surface of the second fin. A punch-through stopper is underlying and adjoining the first FinFET, wherein the punch-through stopper isolates the first fin from the first portion of the semiconductor substrate.

11 Claims, 15 Drawing Sheets

U.S. PATENT DOCUMENTS

| | | | |
|---|---|---|---|
| 7,528,465 B2 | 5/2009 | King et al. | |
| 7,544,994 B2 | 6/2009 | Schepis et al. | |
| 7,560,785 B2 | 7/2009 | Yu et al. | |
| 7,605,449 B2 | 10/2009 | Liu et al. | |
| 7,638,843 B2 | 12/2009 | Xiong et al. | |
| 7,655,989 B2 | 2/2010 | Zhu et al. | |
| 7,662,679 B2 * | 2/2010 | Izumida et al. | 438/157 |
| 7,683,417 B2 | 3/2010 | Xiong et al. | |
| 7,745,871 B2 | 6/2010 | Oh et al. | |
| 7,781,273 B2 | 8/2010 | Schepis et al. | |
| 7,820,551 B2 * | 10/2010 | Yagishita et al. | 438/700 |
| 7,843,000 B2 | 11/2010 | Yu et al. | |
| 7,879,677 B2 * | 2/2011 | Lee | 438/283 |
| 2004/0256683 A1 * | 12/2004 | Lee et al. | 257/412 |
| 2005/0077553 A1 | 4/2005 | Kim et al. | |
| 2005/0153490 A1 | 7/2005 | Yoon et al. | |
| 2005/0199919 A1 * | 9/2005 | Liu et al. | 257/288 |
| 2005/0269629 A1 * | 12/2005 | Lee et al. | 257/327 |
| 2005/0272190 A1 | 12/2005 | Lee et al. | |
| 2005/0272192 A1 | 12/2005 | Oh et al. | |
| 2006/0076625 A1 | 4/2006 | Lee et al. | |
| 2006/0170053 A1 | 8/2006 | Yeo et al. | |
| 2007/0045748 A1 | 3/2007 | Booth, Jr. et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0221956 A1 * | 9/2007 | Inaba | 257/197 |
| 2008/0001171 A1 | 1/2008 | Tezuka et al. | |
| 2008/0006908 A1 | 1/2008 | Lin et al. | |
| 2008/0029828 A1 | 2/2008 | Oh et al. | |
| 2008/0048265 A1 | 2/2008 | Booth, Jr. et al. | |
| 2008/0050866 A1 | 2/2008 | Booth, Jr. et al. | |
| 2008/0050918 A1 | 2/2008 | Dalencourt | |
| 2008/0061370 A1 * | 3/2008 | Matsuo | 257/347 |
| 2008/0122013 A1 | 5/2008 | Schepis et al. | |
| 2008/0128796 A1 | 6/2008 | Zhu et al. | |
| 2008/0128797 A1 * | 6/2008 | Dyer et al. | 257/328 |
| 2008/0157225 A1 * | 7/2008 | Datta et al. | 257/401 |
| 2008/0224258 A1 | 9/2008 | Schepis et al. | |
| 2008/0230852 A1 * | 9/2008 | Yu et al. | 257/401 |
| 2008/0237641 A1 | 10/2008 | Oh et al. | |
| 2008/0265338 A1 * | 10/2008 | Yu et al. | 257/397 |
| 2008/0290470 A1 | 11/2008 | King et al. | |
| 2008/0296632 A1 | 12/2008 | Moroz et al. | |
| 2009/0057846 A1 * | 3/2009 | Doyle et al. | 257/623 |
| 2009/0108316 A1 | 4/2009 | Xiong et al. | |
| 2009/0159972 A1 | 6/2009 | Jakschik et al. | |
| 2009/0181477 A1 | 7/2009 | King et al. | |
| 2009/0206446 A1 | 8/2009 | Russ et al. | |
| 2009/0250769 A1 | 10/2009 | Yu et al. | |
| 2009/0253266 A1 | 10/2009 | Yu et al. | |
| 2009/0278196 A1 | 11/2009 | Chang et al. | |
| 2010/0002494 A1 | 1/2010 | Xiong et al. | |
| 2010/0025740 A1 * | 2/2010 | Lee | 257/288 |
| 2010/0035398 A1 | 2/2010 | Oh et al. | |
| 2010/0041198 A1 | 2/2010 | Zhu et al. | |
| 2010/0044784 A1 | 2/2010 | Oh et al. | |
| 2010/0144121 A1 | 6/2010 | Chang et al. | |
| 2010/0187656 A1 | 7/2010 | Ke et al. | |
| 2010/0213548 A1 | 8/2010 | Chang et al. | |
| 2011/0037129 A1 | 2/2011 | Yu et al. | |
| 2011/0193141 A1 | 8/2011 | Lin et al. | |

FOREIGN PATENT DOCUMENTS

| | | |
|---|---|---|
| CN | 1921116 A | 2/2007 |
| CN | 101038936 A | 9/2007 |
| CN | 101097954 A | 1/2008 |
| JP | 2008-141177 | 6/2008 |

OTHER PUBLICATIONS

Kanemura, T., et al., "Improvement of Drive Current in Bulk-FinFET Using Full 3D Process/Device Simulations," International Conference on Simulation of Semiconductor Processes and Devices (SISPAD), 2006, pp. 131-134.

Liow, T.-Y., et al., "Investigation of Silicon-Germanium Fins Fabricated Using Germanium Condensation on Vertical Compliant Structures," Applied Physics Letters, vol. 87, 2005, pp. 262104-1-262104-3.

Okano, K., et al., "Process Integration Technology and Device Characteristics of CMOS FinFET on Bulk Silicon Substrate with sub-10 nm Fin Width and 20 nm Gate Length," International Electron Devices Meeting, 2005, 4 pages.

Takagi, S., et al., "Carrier-Transport-Enhanced Channel CMOS for Improved Power Consumption and Performance," IEEE Transactions on Electron Devices, vol. 55, No. 1, Jan. 2008, pp. 21-39.

Balakumar, S., et al., "Fabrication of high Ge content SiGe layer on Si by Ge condensation technique," Proceedings of the 13$^{th}$ IPFA 2006, Singapore, IEEE, pp. 301-305.

Tezuka, T., et al., "A Novel Fabrication Technique of Ultrathin and Relaxed SiGe Buffer Layers with High Ge Fraction for Sub-100 nm Strained Silicon-on-Insulator MOSFETs," Japanese Journal of Applied Physics, vol. 40, pp. 2866-2874, Part 1, No. 4B, Apr. 2001, The Japan Society of Applied Physics.

Balakumar, et al., "Fabrication of Thick Germanium-on-Insulator (GeOI) Substrates," Journal of Electronic Materials, vol. 37, No. 7, 2008 (pp. 944-950).

* cited by examiner

US 8,263,462 B2

DIELECTRIC PUNCH-THROUGH STOPPERS FOR FORMING FINFETS HAVING DUAL FIN HEIGHTS

CROSS-REFERENCE TO RELATED APPLICATION

This application relates to commonly assigned U.S. patent application Ser. No. 12/116,074, filed May 6, 2008, entitled "FinFETs Having Dielectric Punch-Through Stoppers," which patent application is incorporated herein by reference.

TECHNICAL FIELD

This invention relates generally to semiconductor devices, and particularly to structures and formation methods of Fin field-effect transistors (FinFETs).

BACKGROUND

With the increasing downscaling of integrated circuits and increasingly higher requirements for integrated circuits, transistors need to have higher drive currents with increasingly smaller dimensions. Fin field-effect transistors (FinFETs) were thus developed. FIGS. 1 and 2 illustrate perspective views of conventional FinFETs. Fins 104 are formed as vertical silicon fins extending above substrate 102, and are used to form source and drain regions 106 and channel regions therebetween (not shown). Vertical gates 108 intersect the channel regions of fins 104. While not shown in FIGS. 1 and 2, gate dielectrics are formed to separate the channel regions from the respective vertical gates 108. The ends of fins 104 receive source and drain doping implants that make these portions of fins 104 conductive.

The structure shown in FIG. 1 is a silicon-on-insulator (SOI) FinFET structure, which is formed using an SOI substrate including semiconductor substrate 102, buried oxide layer (BOX) 110, and an overlying silicon layer. The overlying silicon layer is patterned to form fin 104, on which the FinFET device is based. SOI FinFET devices have excellent electrical performance. However, the manufacturing cost is high.

The structure shown in FIG. 2 is a bulk FinFET structure, which is formed starting from a bulk silicon substrate 102. The manufacturing cost of the bulk FinFETs is lower compared to SOI FinFETs. However, punch-through currents (leakage currents) may flow in a region not controlled by gate 108, as shown as the region 112 in FIG. 3, which is a cross-sectional view of the structure shown in FIG. 2. The cross-sectional view is made through a plane crossing line A-A' in FIG. 2. Conventionally, to reduce the punch-through currents, an impurity implantation is performed using a high energy to dope region 112 to a high impurity concentration, for example, about $10^{19}/cm^3$, wherein the impurity has a conductivity type opposite to that of source/drain regions 106. The implantation is performed after the formation of fin 104, but before the formation of gate 108. The entire fin 104 is thus implanted. By using this method with a high impurity concentration, although the punch-through currents are reduced, the carrier mobility is adversely reduced. Additionally, in this structure the fin height is affected by the position of the top surface of STI region 110, which position is varied in the multiple cleaning processes performed in subsequent manufacturing processes. The fin height variation is thus high, resulting in a device performance variation.

Besides the above-discussed issues, on a same semiconductor chip, FinFETs having different fin heights may be needed. FIGS. 4 and 5 illustrate conventional dual-fin-height structures. Referring to FIG. 4, on silicon substrate 200, fins 202 and 204 are formed with the same heights. Dielectric layer 206 is then formed over silicon substrate 200. Dielectric layer 206 is recessed by different recessing depths, so that the exposed portions of fins 202 and 204 have different heights. The exposed portions of fins 202 and 204 are then used to form FinFETs. The structure as shown in FIG. 4 also suffers from the fin-height variation problem and the degraded carrier mobility due to the requirement for heavily doping the fins in order to reduce leakage currents. Further, in the subsequent gate-etching step, residues of the gate electrode layer may be undesirable left un-etched, causing circuit failure.

FIG. 5, on the other hand, illustrates a dual-fin-height structure formed on a silicon-on-insulator (SOI) substrate including buried oxide layer 210 on silicon substrate 200. The different heights of fins 212 and 214 may be achieved by oxidizing a top portion of fin 212, and removing the resulting oxide. Such formation methods, however, may result in undesired tapered gates in the resulting FinFETs. In addition, the SOI wafers are highly priced.

What is needed in the art, therefore, is formation methods and structures thereof that incorporate FinFETs to take advantage of the benefits associated with the increased drive currents while at the same time overcoming the deficiencies of the prior art.

SUMMARY OF THE INVENTION

In accordance with one embodiment of the present invention, a semiconductor structure includes a semiconductor substrate having a first portion and a second portion. A first Fin field-effect transistor (FinFET) is formed over the first portion of the semiconductor substrate, wherein the first FinFET includes a first fin having a first fin height. A second FinFET is formed over the second portion of the semiconductor substrate, wherein the second FinFET includes a second fin having a second fin height different from the first fin height. A top surface of the first fin is substantially level with a top surface of the second fin. A punch-through stopper is underlying and adjoining the first FinFET, wherein the punch-through stopper isolates the first fin from the first portion of the semiconductor substrate.

In accordance with another embodiment of the present invention, a semiconductor structure includes a semiconductor substrate; a first shallow trench isolation (STI) region over the semiconductor substrate and having a first top surface and a first bottom surface; and a second STI region over the semiconductor substrate. The second STI region has a second top surface substantially level with the first top surface of the first STI region, and a second bottom surface substantially level with the first bottom surface of the first STI region. The semiconductor structure further includes a first fin adjacent to, and above, the first STI region; and a second fin adjacent to, and above, the second STI region. The second fin has a top surface substantially level with a top surface of the first fin. The first fin and the second fin have different fin heights. A lower fin is underlying and vertically aligned to the first fin, wherein the lower fin has a bottom substantially level with the first bottom surface of the first STI region. A punch-through stopper is between and adjoining the first fin and the first lower fin.

In accordance with yet another embodiment of the present invention, a semiconductor structure includes a semiconductor substrate; a first semiconductor fin above the semiconductor substrate and including a first top surface, wherein the first fin includes a first upper portion and a first lower portion; a first punch-through stopper between and adjoining the first upper portion and the first lower portion of the first semiconductor fin; and a second semiconductor fin above the semiconductor substrate. The second semiconductor fin includes a second top surface substantially level with the first top surface of the first semiconductor fin. The second semiconductor fin includes a second upper portion and a second lower portion separated by a second punch-through stopper.

In accordance with yet another embodiment of the present invention, a method of forming a semiconductor structure includes providing a semiconductor substrate; recessing the semiconductor substrate to form a first active region and a second active region; and forming isolation regions in the semiconductor substrate. The isolation regions include a first isolation region having portions on opposite sides of the first active region and a second isolation region having portions on opposite sides of the second active region. Top portions of the first isolation regions are removed to expose sidewalls of the first active region. At a level between a top surface and a bottom surface of the first active region, an intermediate portion of the first active region is oxidized to form a punch-through stopper separating the first active region into a first top fin and a first bottom fin. Sidewalls of the second active region are exposed to form a second top fin.

In accordance with yet another embodiment of the present invention, a method of forming a semiconductor structure includes providing a semiconductor substrate including a first FinFET region and a second FinFET region; and forming a plurality of isolation regions, wherein the plurality of isolation regions defines a first active region in the first FinFET region and a second active region in the second FinFET region. A first recessing is performed on the plurality of isolation regions to expose sidewalls of the first active region. A hard mask is formed to mask the sidewalls of the first active region. A second recessing is performed on the exposed portions of the plurality of isolation regions to expose additional portions of the sidewalls of the first active region below the hard mask. A third recessing is performed on the plurality of isolation regions to expose sidewalls of a top portion of the second active region. The method further includes oxidizing the additional portions of the sidewalls of the first active region to form a punch-through stopper, wherein the punch-through stopper isolates a top portion of the first active region from the semiconductor substrate.

The advantageous features of the embodiments of the present invention include improved accuracy in the formation of dual-fin-height FinFETs, reduced punch-through currents in FinFETs, improved carrier mobility in the channels of the FinFETs, and a low production cost.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments of the present invention provide many applicable inventive concepts that can be embodied in a wide variety of specific contexts. The specific embodiments discussed are merely illustrative of specific ways to make and use the invention, and do not limit the scope of the invention.

Integrated circuit formation processes including the formation of two fins with different fin heights, which fins are used for forming fin field-effect transistors (FinFETs, also referred to as multi-gate transistors or tri-gate transistors), are provided. The intermediate stages of manufacturing embodiments of the present invention are illustrated. The variations of the embodiments are discussed. Throughout the various views and illustrative embodiments of the present invention, like reference numbers are used to designate like elements.

Figure 1:
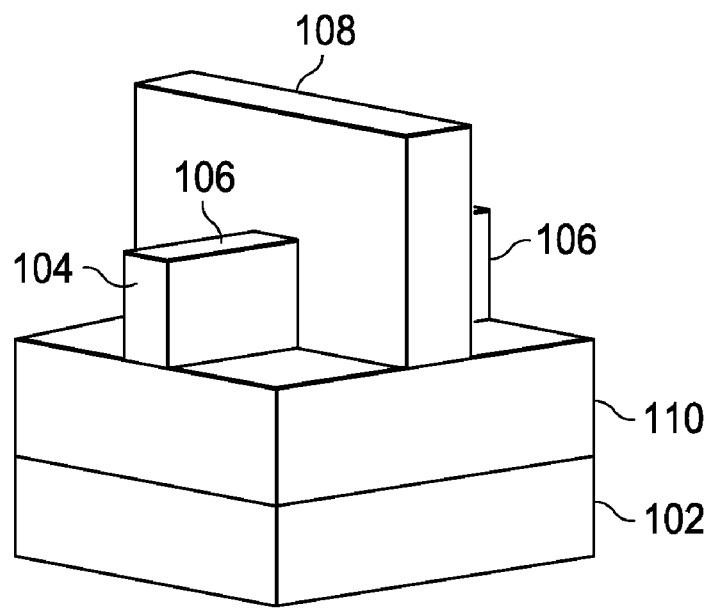
FIG. 1 illustrates a conventional fin field-effect transistor (FinFET) formed on a silicon-on-insulator substrate.
Figure 2:
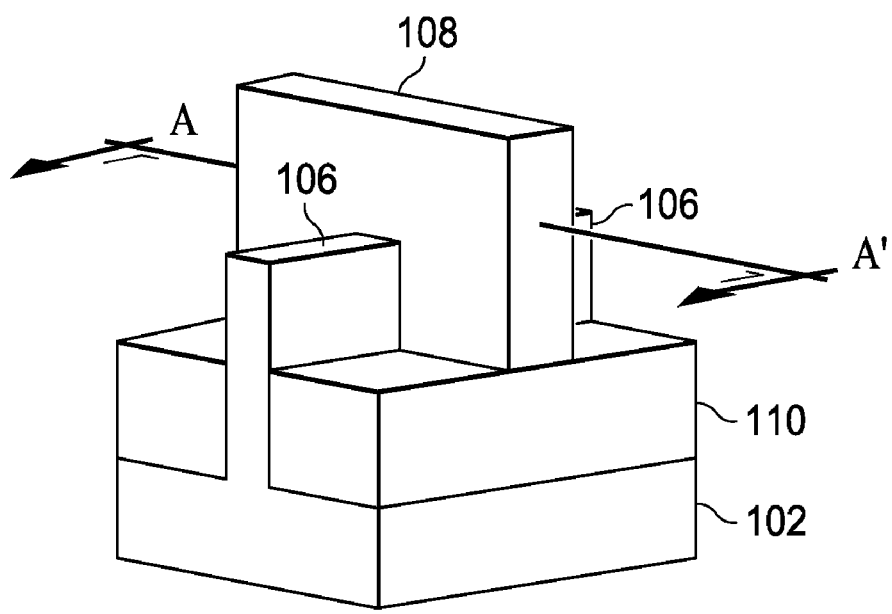
FIG. 2 illustrates a conventional FinFET formed on a bulk substrate.
Figure 3:
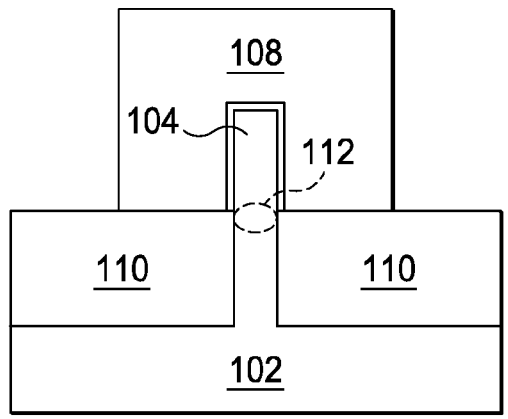
FIG. 3 illustrates a cross-sectional view of the FinFET shown in FIG. 2.
Figure 4:
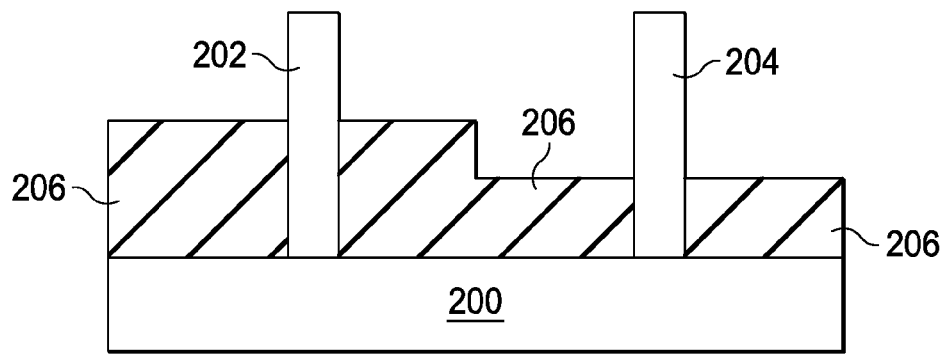
FIGS. 4 and 5 are cross-sectional views of conventional dual-fin-height structures.
Figure 5:
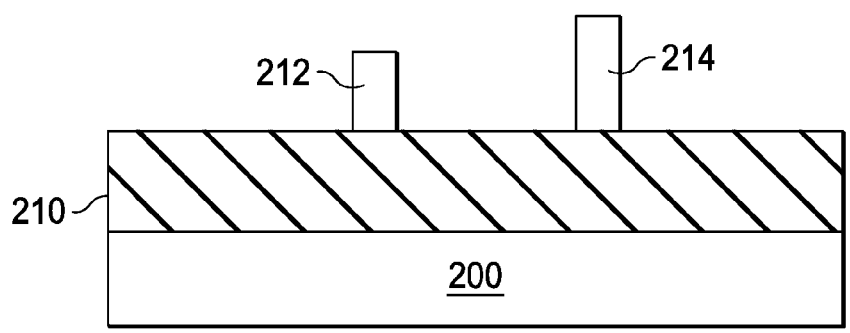
Figure 6:
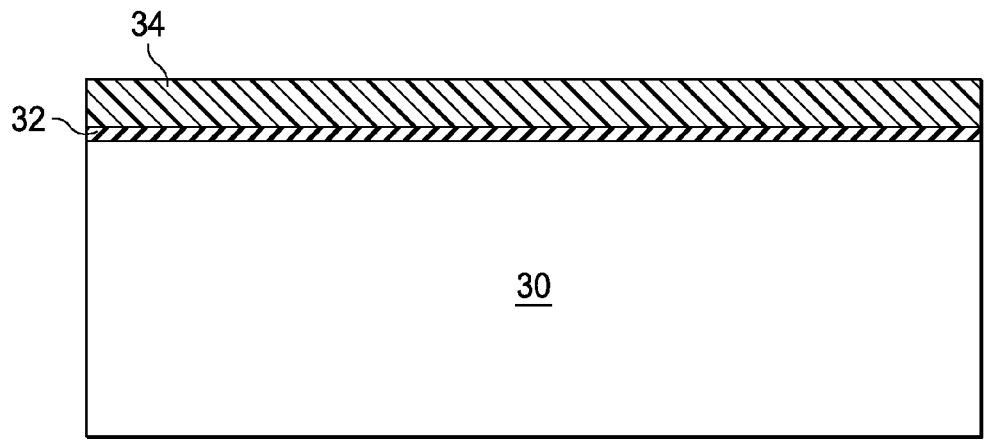
FIGS. 6 through 22 are cross-sectional views of intermediate stages in the manufacturing of a first embodiment of the present invention, which includes two fins having different fin heights.

Referring to FIG. 6, semiconductor substrate 30 is provided. In an embodiment, semiconductor substrate 30 is a bulk silicon substrate. Other commonly used materials, such as carbon, germanium, gallium, arsenic, nitrogen, indium, phosphorus, and the like, may also be included in semiconductor substrate 30. Semiconductor substrate 30 may be in the form of a single-crystal material or a compound material.

Pad layer 32 and mask layer 34 are formed on semiconductor substrate 30. Pad layer 32 is preferably a thin film formed through a thermal process, and thus including silicon oxide. It is used to buffer semiconductor substrate 30 and mask layer 34 so that less stress is generated. Pad layer 32 may also act as an etch stop layer for etching mask layer 34. In an embodiment, mask layer 34 is formed of silicon nitride using low-pressure chemical vapor deposition (LPCVD). In other embodiments, mask layer 34 is formed by thermal nitridation of silicon, plasma enhanced chemical vapor deposition (PECVD), or plasma anodic nitridation using nitrogen-hydrogen. Mask layer 34 may have a thickness of about 60 nm to about 120 nm. It is noted, however, that the dimensions recited throughout the description are merely examples, and may change if the integrated circuits are formed using different technologies.

Figure 7:
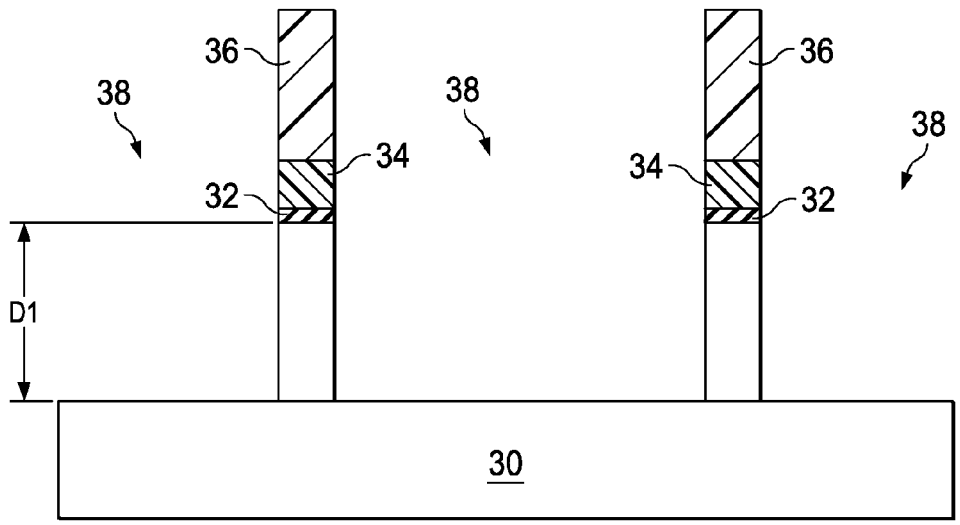

Referring to FIG. 7, photoresist 36 is formed on mask layer 34, and is then patterned, forming openings 38 in photoresist 36. Mask layer 34 and pad layer 32 are then etched through openings 38, exposing underlying semiconductor substrate 30. Next, semiconductor substrate 30 is etched, so that openings 38 extend into semiconductor substrate 30. In an exemplary embodiment, the recessing depth D1 of semiconductor substrate 30 is between about 100 nm and about 300 nm.

Figure 8:
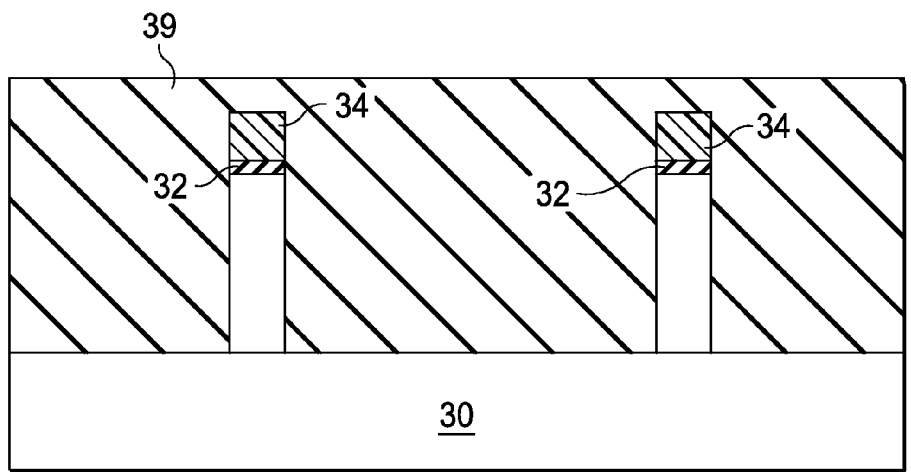
Figure 9:
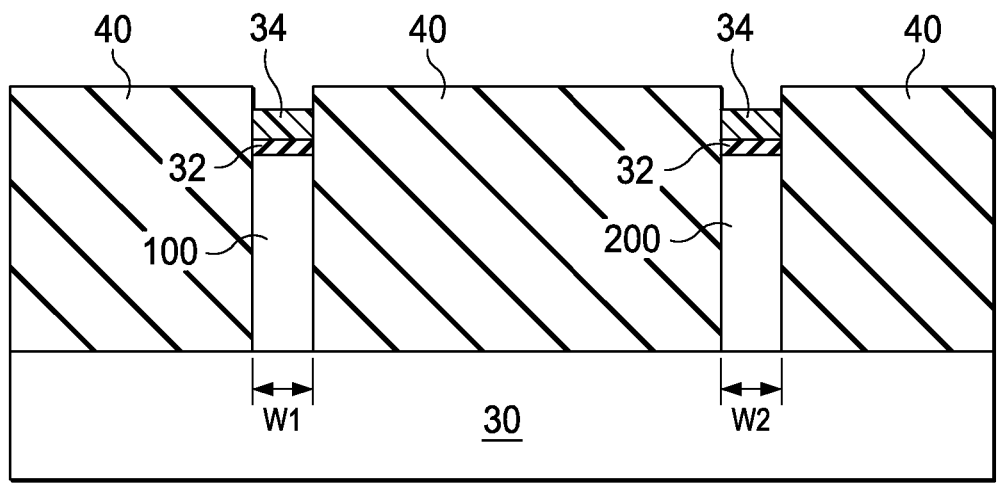

In an embodiment, as shown in FIG. 8, openings 38 are filled with dielectric material 39, for example, silicon oxide formed by sub-atmospheric chemical vapor deposition (SA-CVD). In other embodiments, dielectric layer 39 is formed by high-density plasma chemical vapor deposition (HDP-CVD) or spin on (with spin-on glass (SOG)). A chemical mechanical polish (CMP) is then performed to planarize the surface of the wafer, forming shallow trench isolation (STI) regions 40, and the resulting structure is shown in FIG. 9. Mask layer 34 may be used as a CMP stop layer. STI regions 40 separate active regions 100 and 200, which are used for forming FinFETs. In this case, active regions 100 and 200 may be considered as fins, while the portions of semiconductor substrate 30 lower than the fins may be considered as a substrate. In an exemplary embodiment, width W1 of active region 100 is equal to width W2 of active region 200. In alternative embodiments, widths W1 and W2 could be different.

Figure 10:
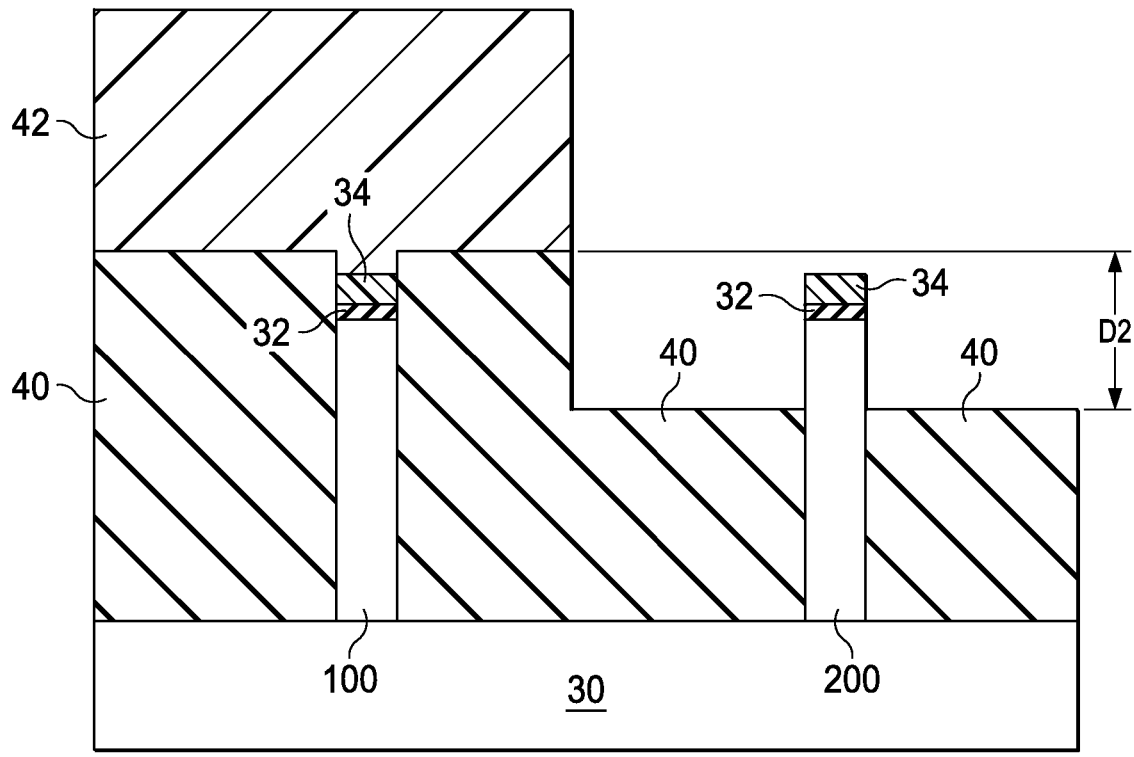

Referring to FIG. 10, photoresist 42 is formed to cover active region 100 and the respective surrounding STI regions 40, while active region 200 and the respective surrounding STI regions 40 are exposed. The exposed STI regions 40 are then recessed. As a result, active region 200 has a portion extending above the surrounding STI regions 40, and thus is alternatively referred to as fin 200. In an exemplary embodiment, the recessing depth D2 is between about 30 nm and about 90. Depth D2 may dominate the fin height difference between active region 100 and 200. Photoresist 42 is then removed.

Figure 11:
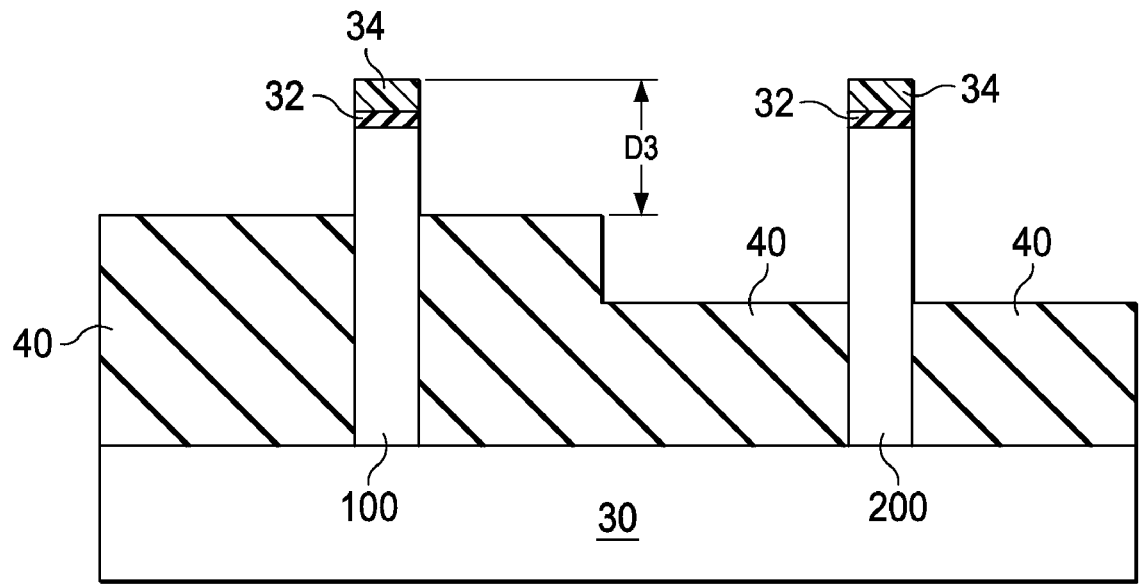

In an embodiment, as shown in FIG. 11, the portions of STI regions 40 surrounding active region 100 is also recessed by recessing depth D3. Sidewalls of active region 100 are hence also exposed. Throughout the description, active region 100 is also referred to as fin 100. In an exemplary embodiment, recessing depth D3 is between about 30 nm and about 90 nm. Next, an annealing in a hydrogen environment is performed. In an embodiment, the hydrogen annealing is performed at between about 850° C. and about 1050° C. The hydrogen annealing causes the migration of silicon atoms, and hence the exposed sidewalls of fin 100 and fin 200 are smoothened.

Figure 12:
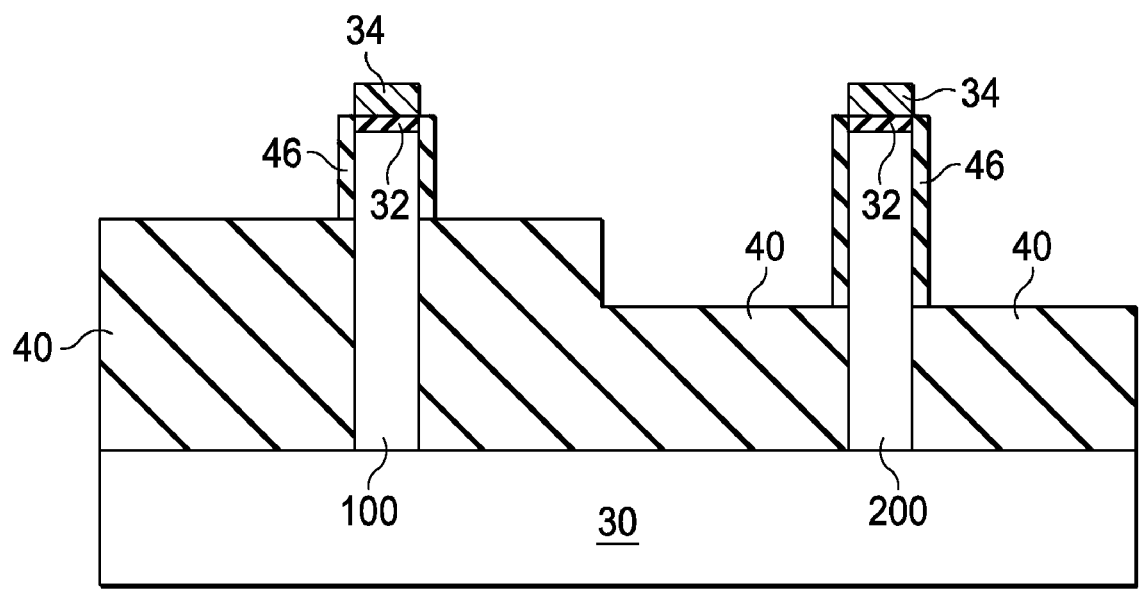
Figure 13:
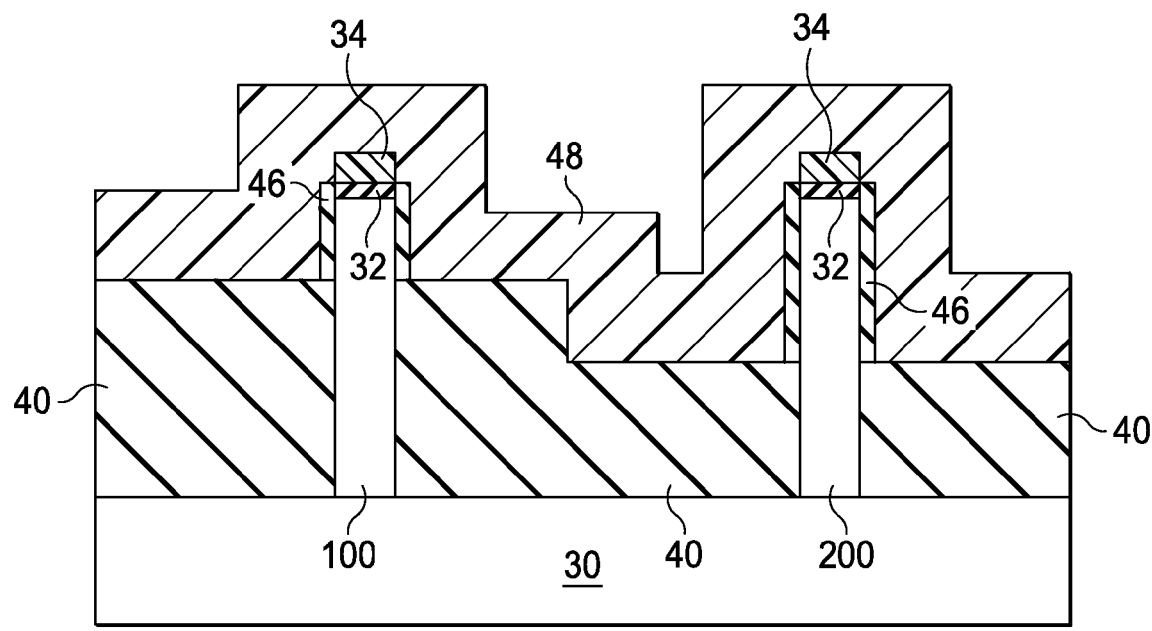

In FIG. 12, an oxidation is performed, and buffer oxide 46 is formed on sidewalls of fins 100 and 200. Buffer oxide 46 may have a thickness of between about 2 nm and about 6 nm, and may be formed at temperatures between about 650° C. and about 1050° C. Next, as is shown in FIG. 13, hard mask 48 is formed, which may also be formed of silicon nitride. In an exemplary embodiment, hard mask 48 has a thickness of between about 10 nm and about 50 nm. The exemplary formation methods include LPCVD, PECVD, and the like. The formation temperature may be between about 400° C. and about 900° C.

Figure 14:
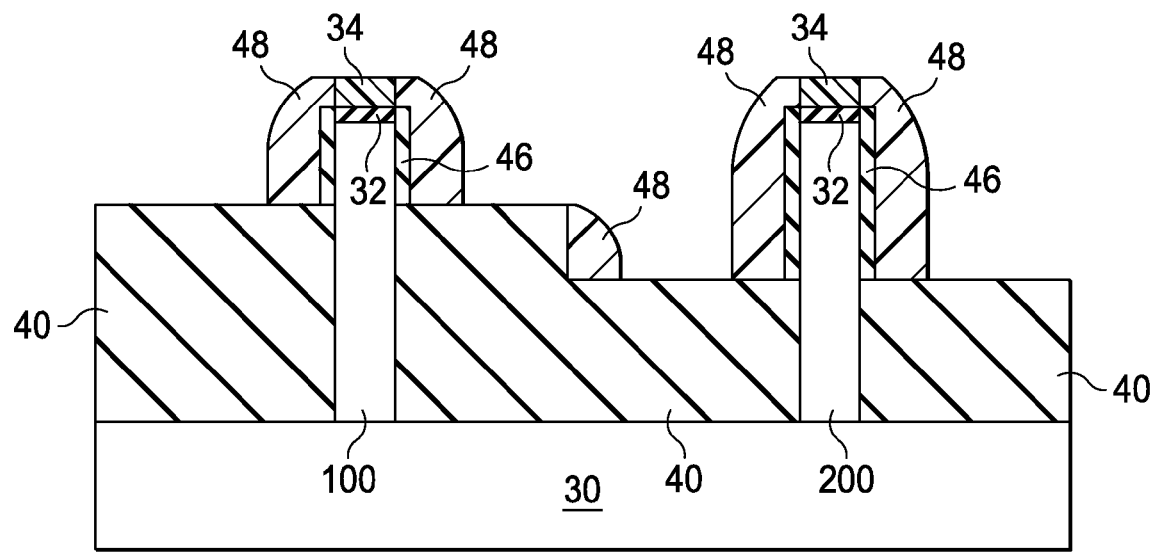
Figure 15:
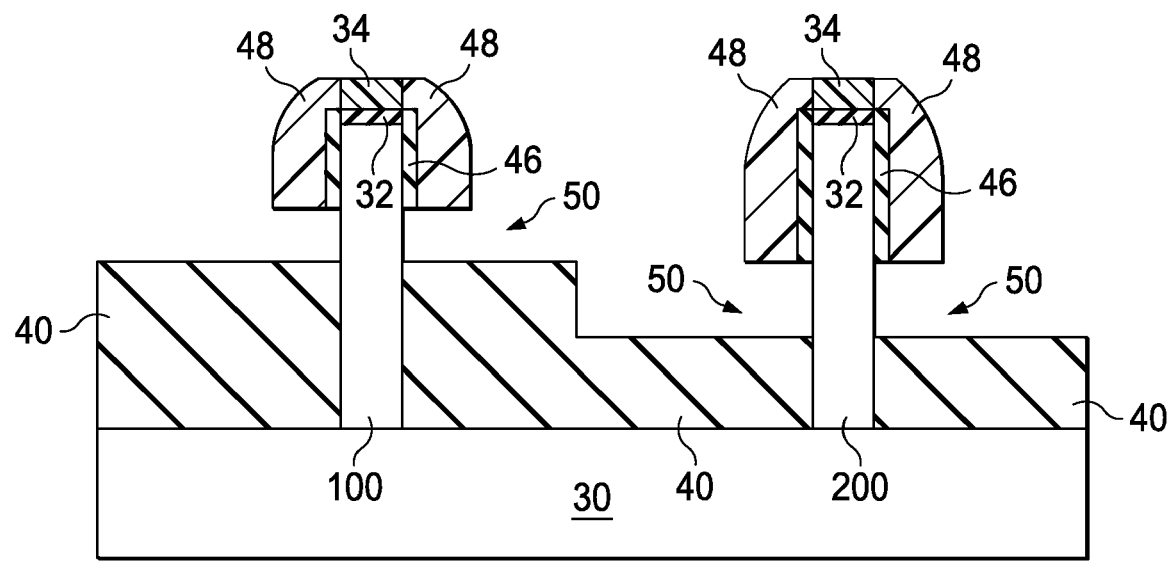

Next, as shown in FIG. 14, an etch, for example, a dry etch, is performed to remove horizontal portions of hard mask 48. At least some vertical portions of hard mask 48 remain unetched. STI regions 40 are exposed through the remaining portions of hard mask 48. Referring to FIG. 15, a wet etch (or other isotropic etches) is performed. In an exemplary embodiment, the wet etch is performed using a mixed solution of HF and NH$_4$F, which may have about 20:1 SiO$_2$/SiN selectivity. Accordingly, the remaining portions of hard mask 48 are substantially un-etched. Since the wet etch is isotropic, recesses 50 extend under the remaining portion of hard mask 48, and the sidewalls of fins 100 and 200 are exposed. Recess region 50 has a depth of between about 30 nm and about 50 nm.

Figure 16:
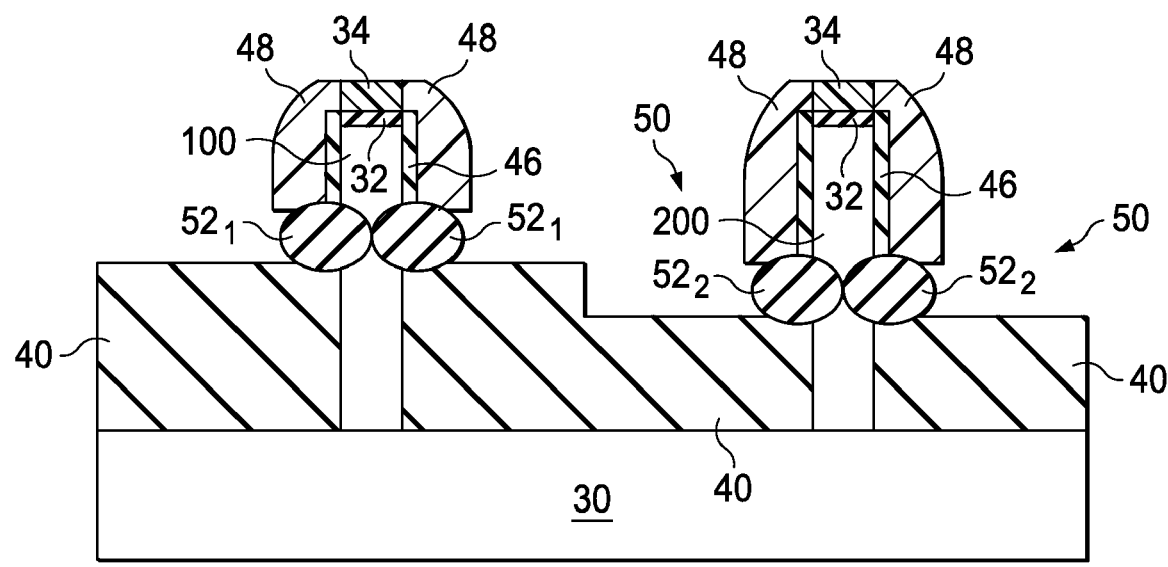

In FIG. 16, a further oxidation is performed, and the exposed portions of fins 100 and 200 are oxidized, forming oxide regions 52 (denoted as oxide regions 52$_1$ and 52$_2$). In an embodiment, the oxide regions 52 formed on opposing sides of the respective fins 100 and 200 join each other, so that the upper portions of fins 100 and 200 are fully isolated from substrate 30. Alternatively, oxide regions 52 substantially, although not completely, isolate the upper portions of the respective fins 100 and 200 from substrate 30. The oxide regions 52 are also referred to as punch-through stoppers due to their function in stopping the punch-through currents. It is likely that the bottom portions of the original fins 100 and/or 200 remain un-oxidized. Advantageously, even if the top surfaces of STI regions 40 surrounding fins 100 and 200 are lowered in subsequent cleaning processes, the fin heights (which are independent from the level of the top surface of STI regions 40) of fins 100 and 200 are fixed, resulting in more stable performance of the resulting FinFET.

Figure 17:
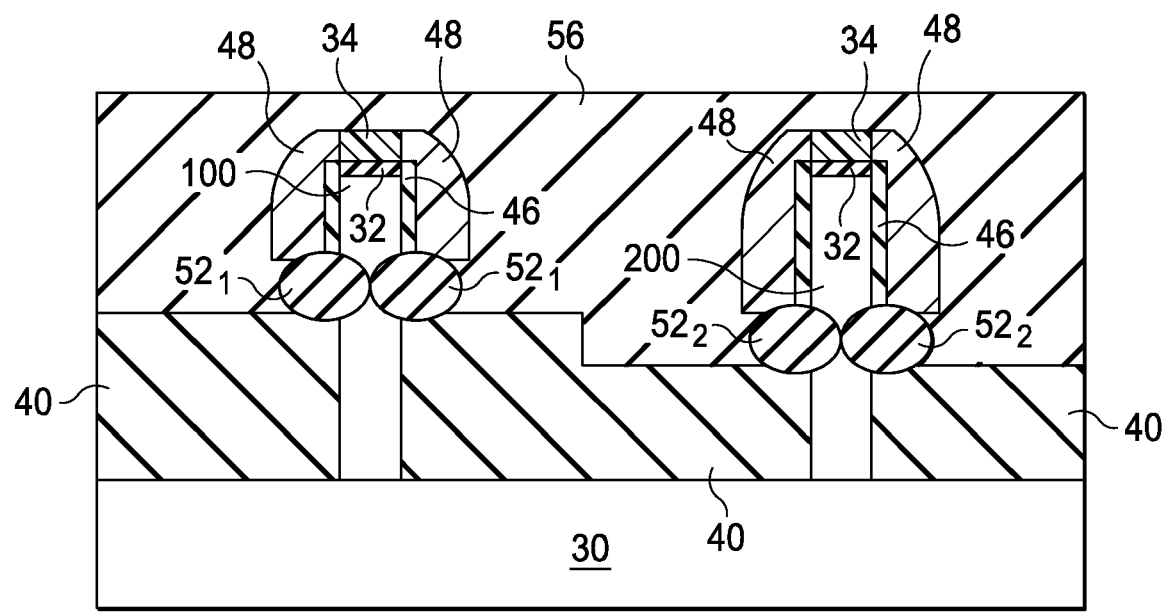
Figure 18:
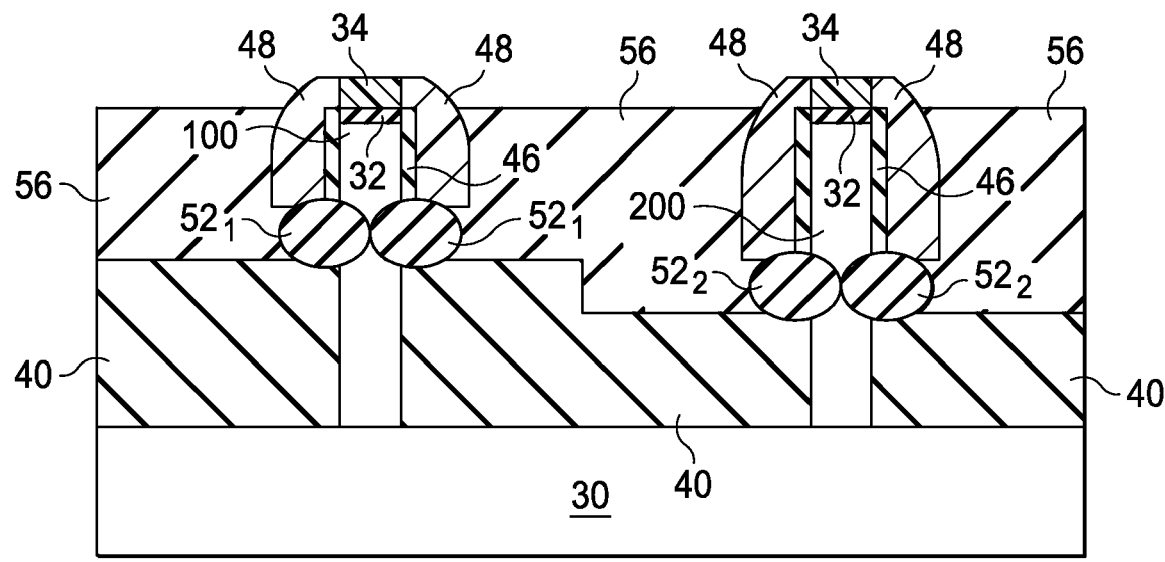

Referring to FIG. 17, oxide 56 is filled into recesses 50 (as shown in FIG. 16) until the top surface of oxide 56 is higher than the top surface of mask layer 34. In an embodiment, high aspect ratio process (HARP) oxide is used for its good gap-filling ability, although oxide 56 may also be formed using other methods with a good gap-filling ability, such as sub-atmospheric chemical vapor deposition (SACVD), and even high-density plasma CVD (HDPCVD). A CMP is then performed to remove excess oxide 56 until mask layer 34 is exposed, wherein mask layer 34 is used as a CMP stop layer. The resulting structure is shown in FIG. 18.

Figure 19:
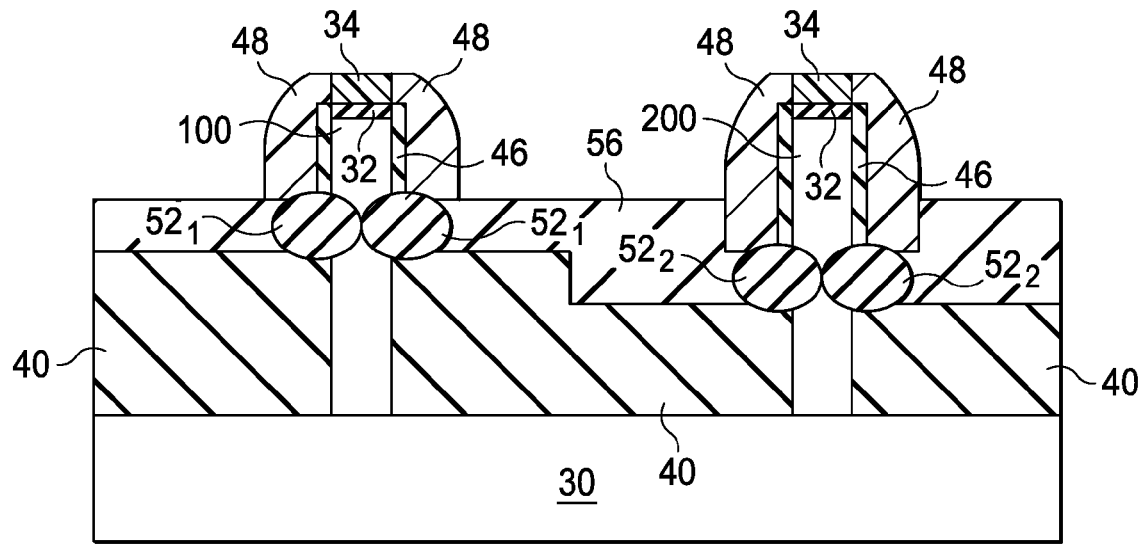
Figure 20:
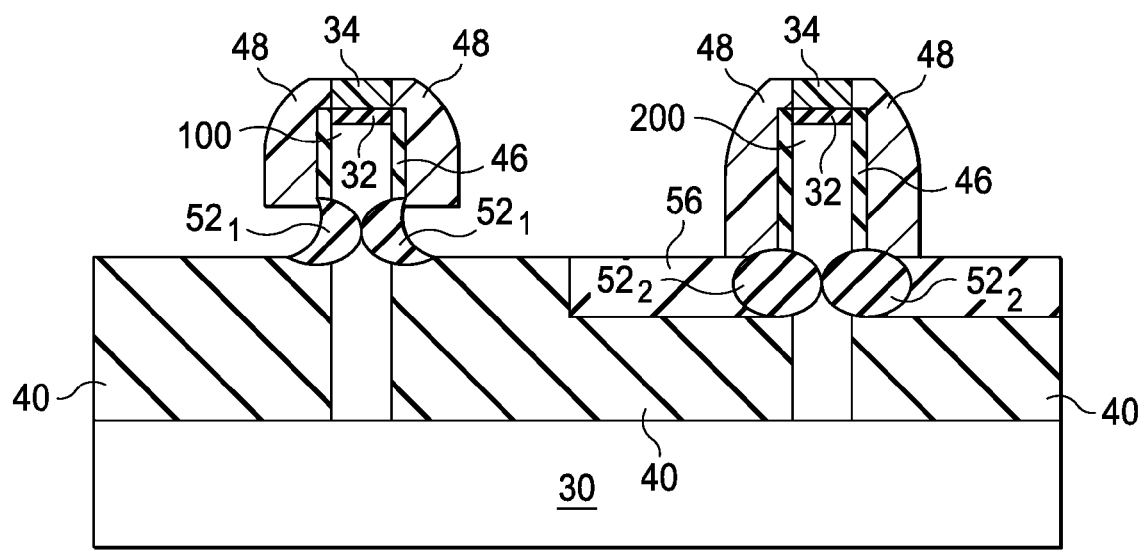

In FIG. 19, an etching, for example, a dry etching, is performed to recess oxide 56. The etching may stop at a position level with the top surface of oxide regions 52$_1$, or slightly higher or lower than the top surface of oxide regions 52$_1$. Next, as shown in FIG. 20, an isotropic etching, for example, a wet etching, is performed to further recess oxide 56 to level with the top surfaces of the oxide regions 52$_2$ in fin 200. Again, the recessing of oxide 56 may stop at a level slightly higher or lower than the top surface of oxide regions 52$_2$.

Figure 21:
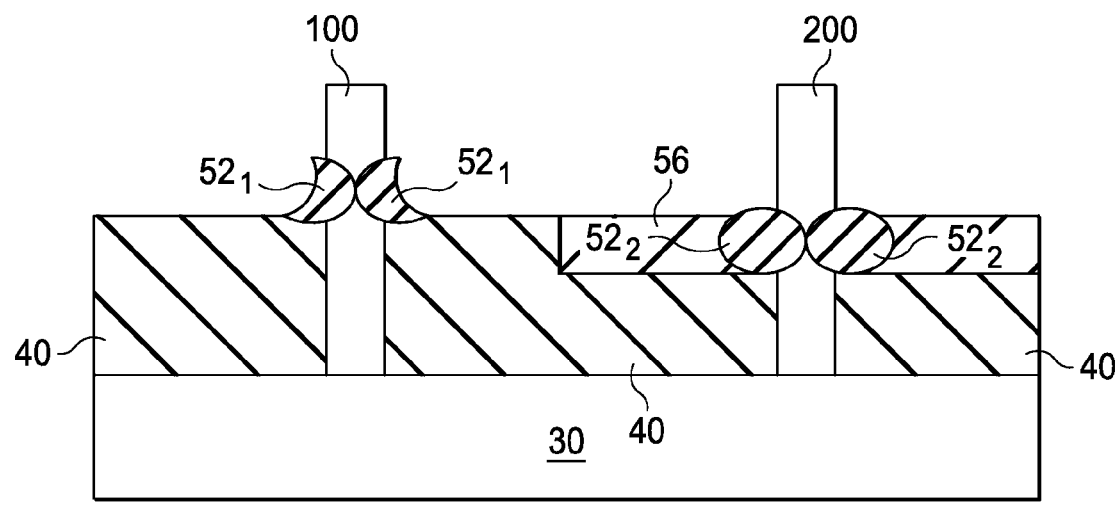

In FIG. 21, the remaining hard masks 34 and 48 are removed, followed by the removal of pad layer 32 and buffer oxide 46. The resulting structure as shown in FIG. 21 illustrates fins 100 and 200 having different fin heights. Advantageously, fins 100 and 200 are fully electrically isolated from substrate 30.

Figure 22:
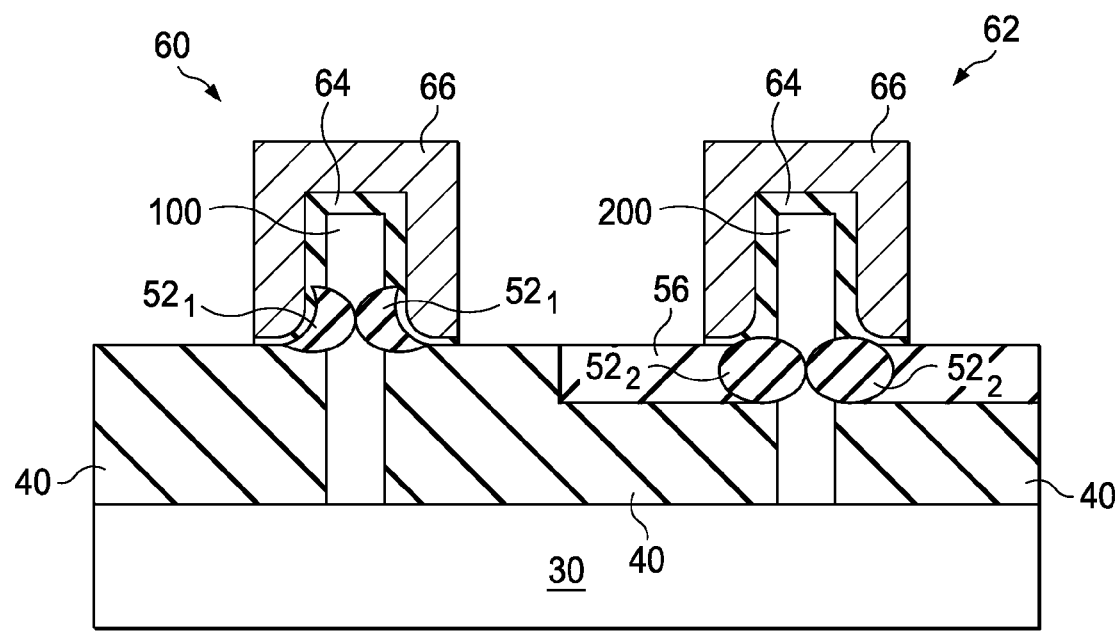

Next, gate stacks may be formed, as is shown in FIG. 22. Each of the resulting FinFET transistors 60 and 62 may include lightly doped source and drain regions, source and drain regions (not shown), gate dielectrics 64, and gate electrodes 66. The processes for forming FinFETs 60 and 62 are known in the art, and hence are not described herein.

Figure 23:
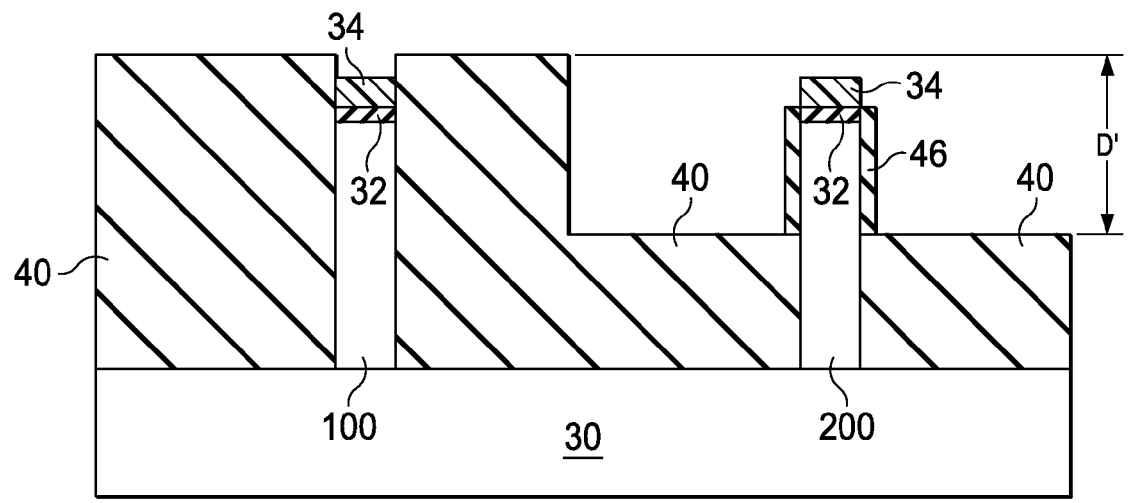
FIGS. 23 through 31 are cross-sectional views of intermediate stages in the manufacturing of a second embodiment of the present invention, which again includes two fins having different fin heights.
Figure 24:
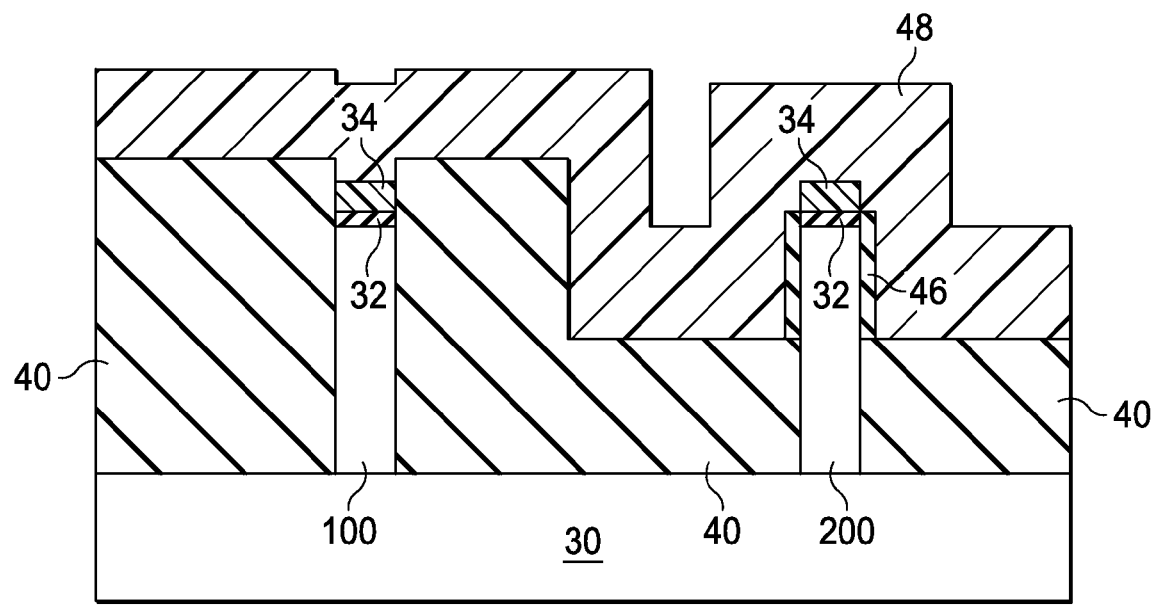
Figure 25:
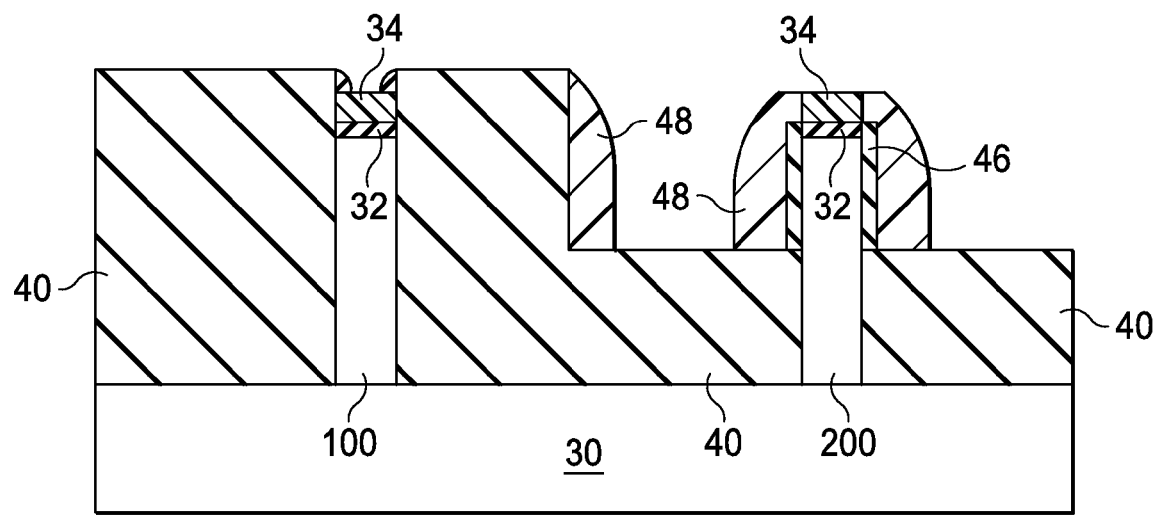

FIGS. 23 through 31 illustrate cross-sectional views of intermediate stages in the manufacturing of another embodiment of the present invention. Unless specified otherwise, the materials and formation methods of the components in this embodiment are essentially the same as the like components, which are denoted by like reference numerals in the embodiment shown in FIGS. 6 through 22. The formation details of the embodiment shown in FIGS. 23 through 31 may thus be found in the discussion of the embodiment shown in FIGS. 6 through 22. The initial steps of this embodiment are essentially the same as shown in FIGS. 6 through 10, wherein the resulting structure as shown in FIG. 23 is similar to the structure as shown in FIG. 10. STI regions 40 are recessed to recessing depth D', wherein recessing depth D' is between about 30 nm and about 90 nm. In this embodiment, however, the portions of STI regions 40 surrounding active region 200 are recessed, while the portions of STI regions 40 surrounding active region 100 are not recessed. FIG. 23 also illustrates the formation of buffer layer 46. Next, as shown in FIG. 24, hard mask 48 is formed, followed by a dry etching to remove its horizontal portions. As a result, the remaining portions of hard mask 48 covers sidewalls of active region 200 (with buffer oxides 46 between hard mask 48 and active region 200), as shown in FIG. 25.

Figure 26:
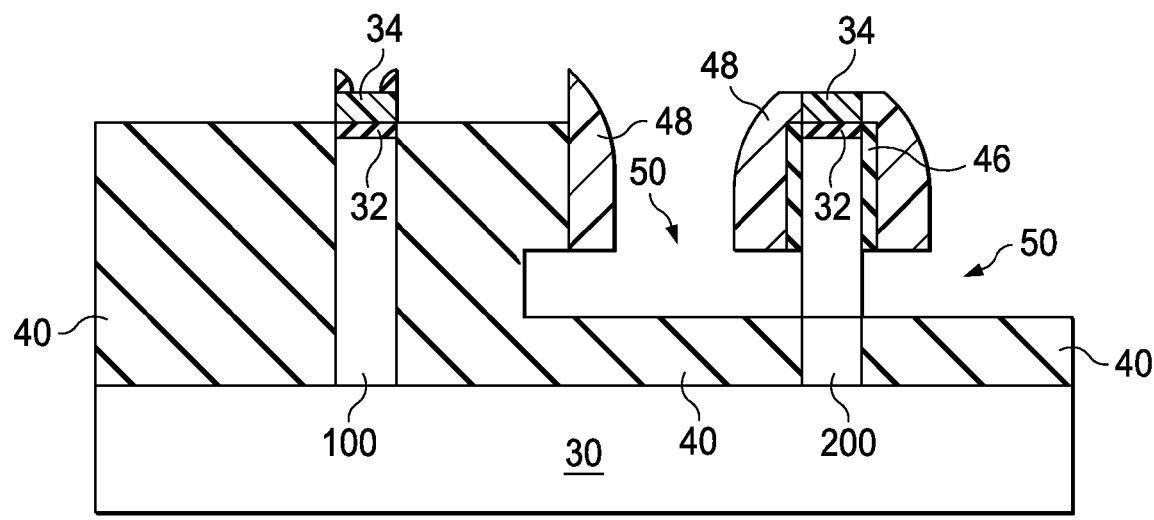
Figure 27:
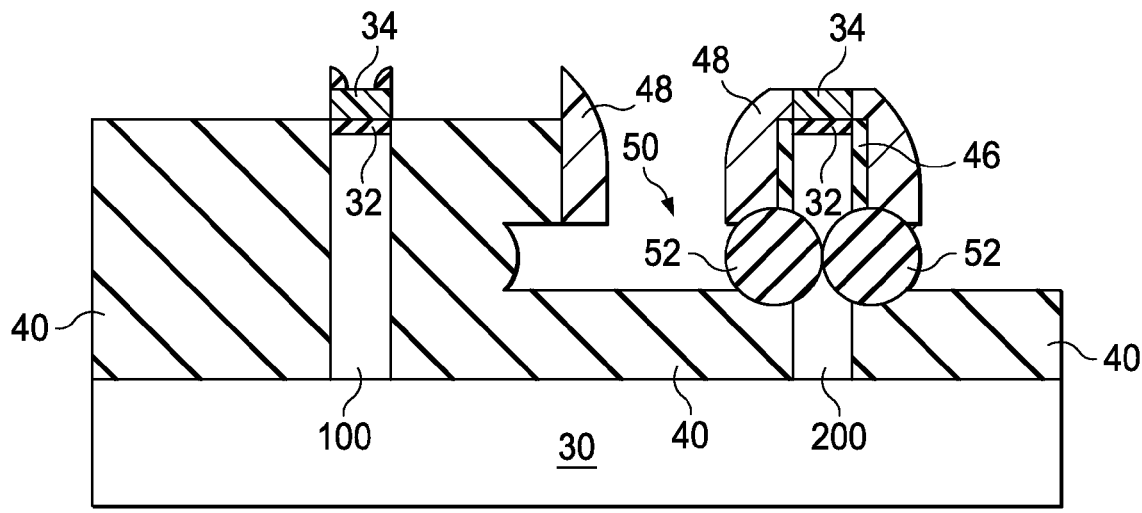

Next, as shown in FIG. 26, an isotropic etching, preferably a wet etching, is performed to remove the top portions of STI regions 40 surrounding fin 200, exposing sidewalls of fin 200, as is shown in FIG. 26. On the other hand, fin 100 is spaced apart from recesses 50 by an adequate margin, so that the sidewalls of fin 100 are not exposed. Recess region 50 has a depth between about 30 nm and about 50 nm. In FIG. 27, an oxidation is performed to form punch-through stoppers 52. Again, punch-through stoppers 52 preferably fully electrically isolate substrate 30 from fin 200. On the other hand, since the sidewalls of fin 100 are protected by STI regions 40, no punch-through stoppers are formed in fin 100.

Figure 28:
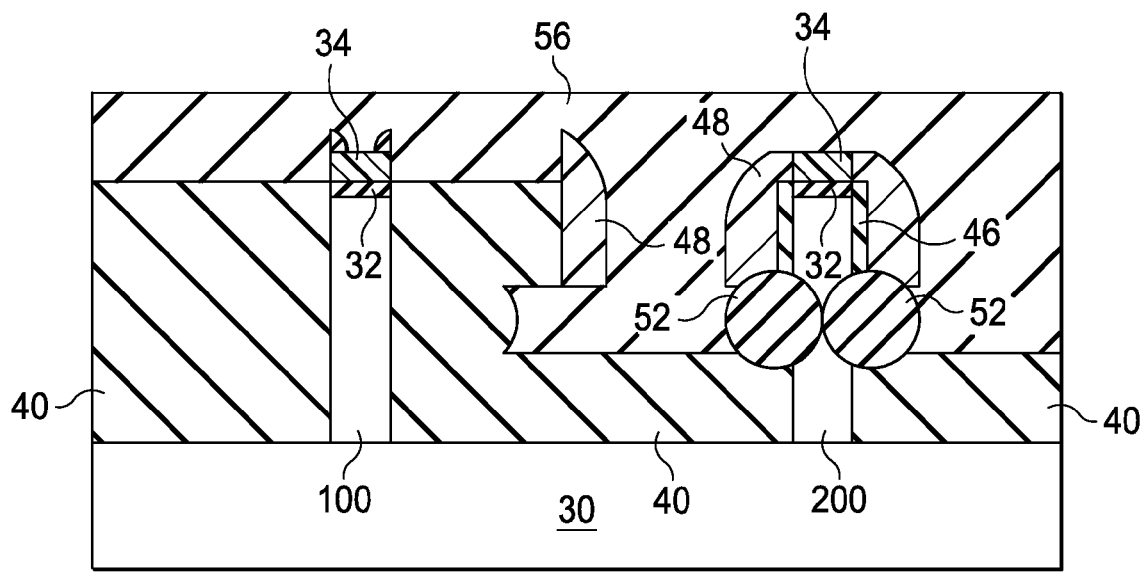
Figure 29:
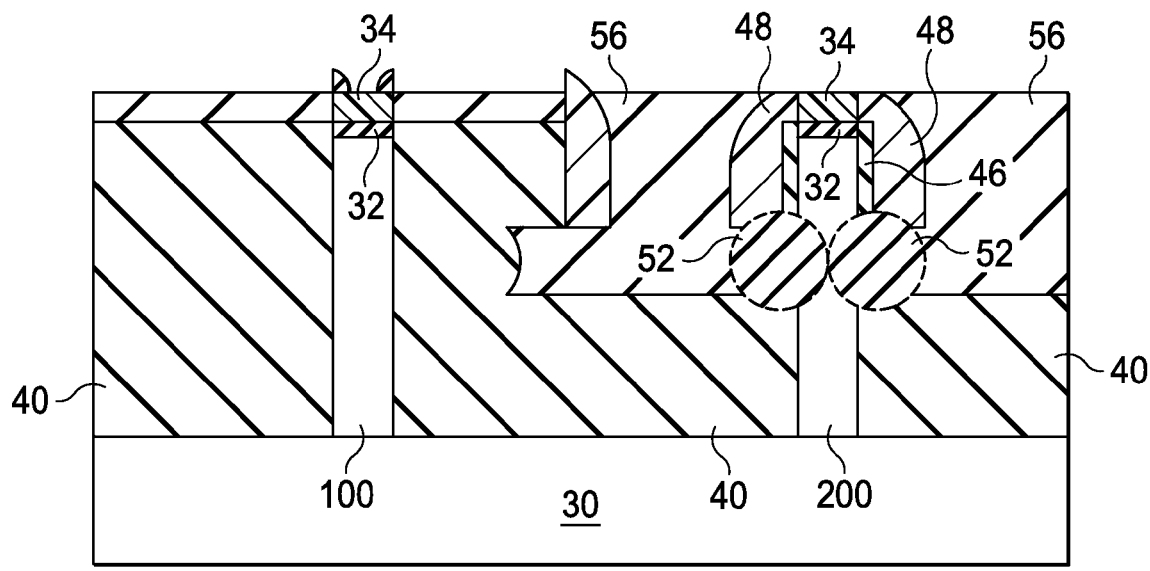
Figure 30:
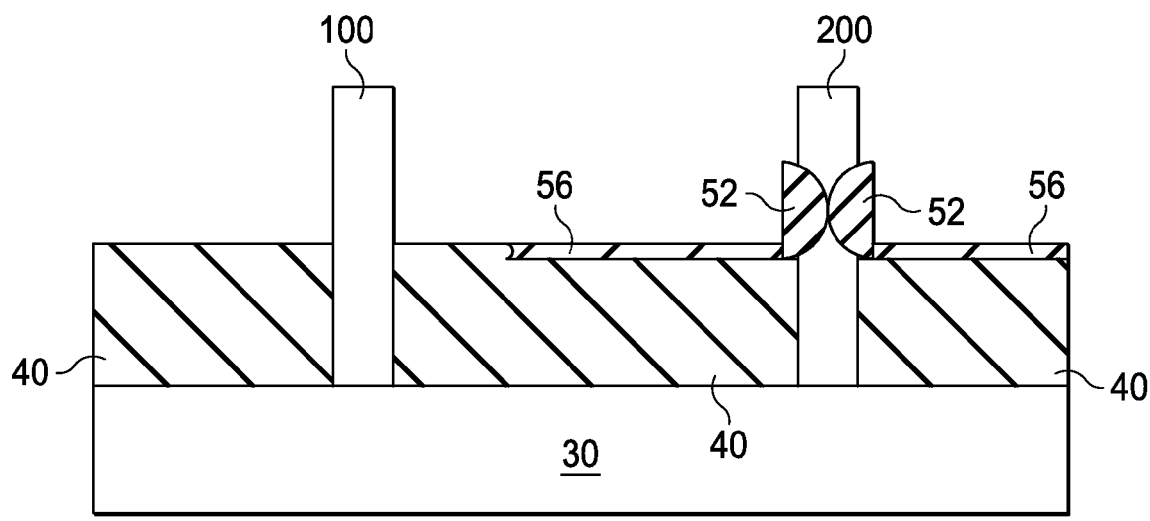
Figure 31:
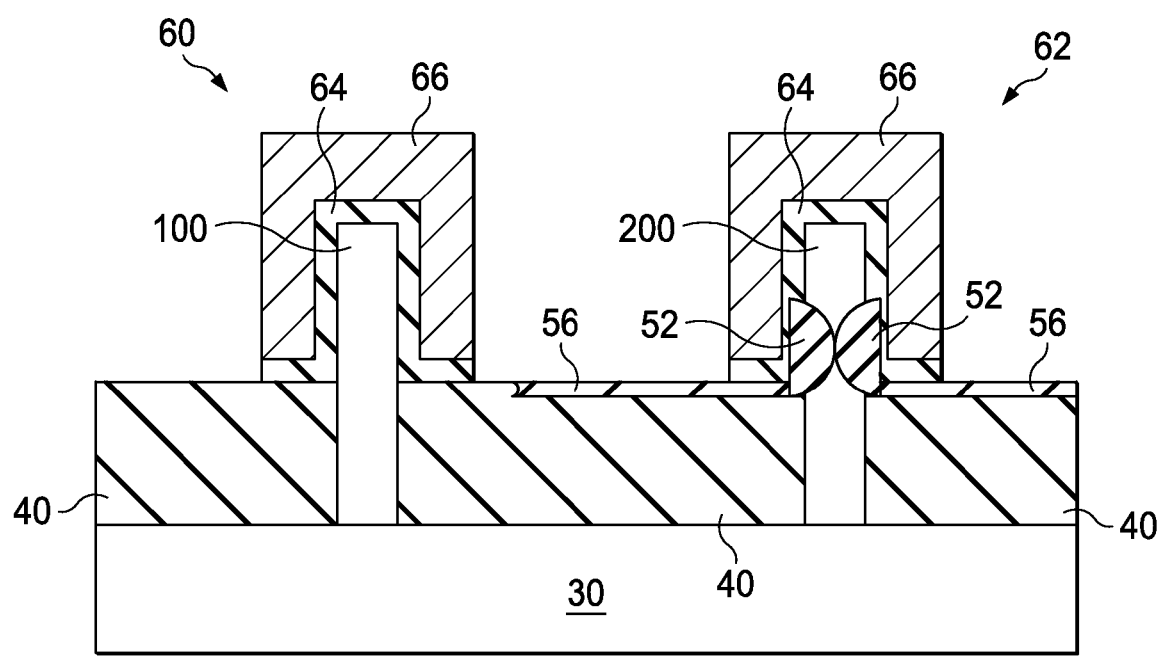

Referring to FIG. 28, oxide 56 is formed to fill gaps, and is then planarized until a top surface of hard mask layer 34 is exposed. The resulting structure is shown in FIG. 29. Next, as shown in FIG. 30, oxide 56 and possibly STI regions 40 are recessed, for example, by a dry etch. The etching may be performed using essentially the same method as shown in FIG. 19. Hard masks 34 and 48, pad layer 32, and buffer layer 46 are then removed. After the recessing of oxide 56 and possibly STI regions 40, the portion of active region 100 above STI regions 40 form fin 100. The top surface of the remaining portions of STI regions 40 may be at a different level than the bottom of fin 200. Accordingly, fins 100 and 200 may have different heights. By adjusting the recessing depth of oxide 56 and STI regions 40, the height of fin 100 can be adjusted. Gate dielectrics 64, gate electrodes 66, and source/drain regions (not shown) may then be formed, and the resulting structure FinFETs 60 and 62 are shown in FIG. 31.

The embodiments of the present have several advantageous features. Fins with different fin heights may be integrated on a same semiconductor chip. The FinFETs formed using the embodiments of the present invention have reduced, and possibly substantially eliminated, punch-through currents due to the formation of punch-through stoppers, which fully isolate source and drain regions from the possible punch-through current paths. Since the surface of STI regions 40 that encircles fin 100 is level with the surface of STI regions 40 encircling fin 200, the subsequent FinFET formation process is free from step height problems.

The reduction in the punch-through currents does not require highly-priced SOI substrates. In addition, the channel regions do not require high impurity (well) concentrations, and the fin heights do not vary with the variation in the position of the top surface of STI regions. These result in a smaller variation in the FinFET performance. The formation of the FinFETs is fully compatible with the formation of planar transistors.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A semiconductor structure comprising:
   a semiconductor substrate comprising a first portion and a second portion;
   a first shallow trench isolation (STI) region and a second STI region, wherein the first STI region has a first top surface substantially level with a second top surface of the second STI region;
   a first Fin field-effect transistor (FinFET) over the first portion of the semiconductor substrate, wherein the first FinFET comprises a first fin having a first fin height, wherein the first fin is adjacent to and above the first STI region;
   a second FinFET over the second portion of the semiconductor substrate, wherein the second FinFET comprises a second fin having a second fin height different from the first fin height, wherein the second fin is adjacent to and above the second STI region, and wherein a first top surface of the first fin is substantially level with a second top surface of the second fin;
   a punch-through stopper underlying and adjoining the first FinFET, wherein the punch-through stopper isolates the first fin from the first portion of the semiconductor substrate, and wherein the punch-through stopper is formed of a dielectric material that is an oxidized portion of the first fin; and
   an additional fin underlying and at least partially vertically overlapping the first fin, wherein the punch-through stopper electrically disconnects the additional fin from the first fin.

2. The semiconductor structure of claim 1, wherein a first bottom surface of the first STI region is substantially level with a second bottom surface of the second STI region.

3. The semiconductor structure of claim 1 further comprising an additional punch-through stopper underlying and adjoining the second fin, wherein the punch-through stopper and the additional punch-through stopper are not level with each other.

4. The semiconductor structure of claim 3 further comprising an additional fin directly underlying and adjoining the additional punch-through stopper, and wherein the additional fin and the second fin have substantially a same width.

5. The semiconductor structure of claim 1, wherein the punch-through stopper comprises an oxide of the semiconductor substrate.

6. The semiconductor structure of claim 1, wherein the first and the second fins are substantially above the first and the second STI regions, respectively, and wherein the first and the second fin heights are the heights measured from above the first and the second STI regions, respectively.

7. A semiconductor structure comprising:
   a semiconductor substrate comprising a first portion and a second portion;
   a first Fin field-effect transistor (FinFET) over the first portion of the semiconductor substrate, wherein the first FinFET comprises a first fin having a first fin height;
   a second FinFET over the second portion of the semiconductor substrate, wherein the second FinFET comprises a second fin having a second fin height different from the first fin height, and wherein a first top surface of the first fin is substantially level with a second top surface of the second fin;
   a first shallow trench isolation (STI) region adjacent the first fin, wherein the first fin is above the first STI region;
   a second STI region adjacent the second fin, wherein the second fin is above the second STI region, and wherein the first STI region has a first top surface substantially level with a second top surface of the second STI region; and a punch-through stopper underlying and adjoining the first FinFET, wherein the punch-through stopper isolates the first fin from the first portion of the semiconductor substrate, and wherein the punch-through stopper is an oxidized portion of the first fin.

8. The semiconductor structure of claim 7, wherein a first bottom surface of the first STI region is substantially level with a second bottom surface of the second STI region.

9. The semiconductor structure of claim 7 further comprising an additional fin directly underlying the first fin, wherein the punch-through stopper electrically disconnects the additional fin from the first fin.

10. The semiconductor structure of claim 7 further comprising an additional punch-through stopper underlying and adjoining the second fin, wherein the punch-through stopper and the additional punch-through stopper are not level with each other.

11. The semiconductor structure of claim 7, wherein the first and the second fins are substantially above the first and the second STI regions, respectively, and wherein the first and the second fin heights are the heights measured from above the first and the second STI regions, respectively.

* * * * *